(12) United States Patent
Hirose et al.

(10) Patent No.: US 11,898,903 B2
(45) Date of Patent: Feb. 13, 2024

(54) OPTICAL SENSOR

(71) Applicant: Sumitomo Electric Industries, Ltd., Osaka (JP)

(72) Inventors: Kotaro Hirose, Osaka (JP); Masahiro Adachi, Osaka (JP); Yoshiyuki Yamamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 174 days.

(21) Appl. No.: 17/437,839

(22) PCT Filed: Apr. 13, 2020

(86) PCT No.: PCT/JP2020/016303
§ 371 (c)(1),
(2) Date: Sep. 10, 2021

(87) PCT Pub. No.: WO2020/213569
PCT Pub. Date: Oct. 22, 2020

(65) Prior Publication Data
US 2022/0155141 A1 May 19, 2022

(30) Foreign Application Priority Data
Apr. 16, 2019 (JP) .................................. 2019-077558

(51) Int. Cl.
*H10N 10/17* (2023.01)
*H10N 10/851* (2023.01)
*G01J 1/02* (2006.01)

(52) U.S. Cl.
CPC ............ *G01J 1/0252* (2013.01); *H10N 10/17* (2023.02); *H10N 10/851* (2023.02)

(58) Field of Classification Search
CPC ...... H10N 10/17; H10N 10/851; G01J 1/0252
See application file for complete search history.

(56) References Cited

U.S. PATENT DOCUMENTS 6,305,840 B1 * 10/2001 Kim .......................... G01J 5/12
438/54
6,348,650 B1 2/2002 Endo et al.
(Continued)

FOREIGN PATENT DOCUMENTS

JP 3-276772 A 12/1991
JP 2000-340848 A 12/2000
(Continued)

*Primary Examiner* — Tamir Ayad
(74) *Attorney, Agent, or Firm* — XSENSUS LLP

(57) ABSTRACT

An optical sensor includes a support layer, a thermoelectric conversion material portion disposed on the support layer and including a strip-shaped first material layer that converts thermal energy into electrical energy and a strip-shaped second material layer that is electrically conductive, and a light absorbing film disposed on the thermoelectric conversion material portion to form a temperature difference in a longitudinal direction of the first material layer. The first material layer includes a first region and a second region. The second material layer includes a third region and a fourth region connected to the second region. The optical sensor further includes a first electrode electrically connected to the first region, and a second electrode disposed apart from the first electrode and electrically connected to the third region. The first material layer has a width, perpendicular to the longitudinal direction, of 0.1 μm or more.

9 Claims, 7 Drawing Sheets

(56) References Cited

U.S. PATENT DOCUMENTS

| | | | | |
|---|---|---|---|---|
| 9,929,333 B1* | 3/2018 | Emadi | ............... | H10N 10/851 |
| 2018/0190891 A1* | 7/2018 | Adachi | ............... | G01J 1/0407 |
| 2018/0254401 A1 | 9/2018 | Hayashi et al. | | |

FOREIGN PATENT DOCUMENTS

| | | | | |
|---|---|---|---|---|
| WO | WO-2017002514 A1 * | 1/2017 | ............ | C01B 33/06 |
| WO | 2017/086271 A1 | 5/2017 | | |

* cited by examiner

OPTICAL SENSOR

CROSS-REFERENCE TO RELATED APPLICATIONS

The present application is based on PCT filing PCT/JP2020/016303, filed Apr. 13, 2020, which claims priority to Japanese Patent Application No. 2019-077558, filed on Apr. 16, 2019, the entire contents of each are incorporated herein by reference.

TECHNICAL FIELD

The present disclosure relates to an optical sensor.

BACKGROUND ART

A technology concerning a thermopile-type infrared sensor that uses a thermoelectric conversion material that converts a temperature difference (thermal energy) into electrical energy is known (see, for example, Patent Literature 1). The infrared sensor includes a light receiving portion that converts light energy into thermal energy, and a thermoelectric conversion portion (thermopile) that converts the temperature difference (thermal energy) into electrical energy. In the thermoelectric conversion portion, a plurality of pieces of p-type thermoelectric conversion material and a plurality of pieces of n-type thermoelectric conversion material are alternately connected in series to increase the output.

The thermopile-type infrared sensor has its sensitivity $Rv$ obtained by the following expression (1). The specific detectivity $D^*$ of the thermopile-type infrared sensor is obtained by the following expression (2).

$$Rv = \eta \cdot N \cdot (\alpha_1 + \alpha_2)/(G_{th} \cdot (1+(\omega\tau)^2))^{1/2} \quad (1)$$

$$D^* = \eta \cdot N \cdot (\alpha_1 + \alpha_2) \cdot (A \cdot G_{el}/(4 \cdot k \cdot T))^{1/2}/G_{th} \quad (2)$$

In the expressions, $Rv$ represents sensitivity, $D^*$ represents specific detectivity, $N$ represents the number of thermocouples (thermocouple pairs) of the thermopile, $\eta$ represents light-heat conversion efficiency of the light receiving portion, $\alpha_1$ represents Seebeck coefficient of the p-type thermoelectric conversion material, $\alpha_2$ represents Seebeck coefficient of the n-type thermoelectric conversion material, $\omega$ represents angular frequency, represents response time constant, $A$ represents light receiving area, $k$ represents Boltzmann's constant, $T$ represents absolute temperature, $G_{th}$ represents thermal conductance, and $G_{el}$ represents electrical conductance. The thermal conductance $G_{th}$ is obtained by the following expression (3). The electrical conductance $G_{el}$ is obtained by the following expression (4).

[Math. 1]

$$G_{th} = \sum_{n=1}^{N} \kappa_n \cdot \frac{S_n}{l_n} \quad (3)$$

$$G_{el} = \frac{1}{\sum_{n=1}^{N} \frac{l_n}{\sigma_n S_n}} \quad (4)$$

In the expressions, $\kappa$ represents thermal conductivity, $\sigma$ represents electrical conductivity, $S$ represents cross-sectional area of a piece of thermoelectric conversion material, and $l$ represents length of a piece of thermoelectric conversion material.

The sensitivity $Rv$ and the specific detectivity $D^*$ are both functions expressed by the thermal conductance $G_{th}$. Decreasing the thermal conductance GI, is important to improve the sensitivity $Rv$ and the specific detectivity $D^*$.

CITATION LIST

Patent Literature

Patent Literature 1: Japanese Patent Application Laid-Open No. 2000-340848

SUMMARY OF INVENTION

Solution to Problem

An optical sensor according to the present disclosure includes: a support layer; a thermoelectric conversion material portion disposed on the support layer, the portion including a strip-shaped first material layer that converts thermal energy into electrical energy and a strip-shaped second material layer that is electrically conductive; and a light absorbing film disposed on the thermoelectric conversion material portion to form a temperature difference in a longitudinal direction of the first material layer, the film converting received light into thermal energy. The first material layer includes a first region including a first end located on one side in the longitudinal direction, and a second region including a second end located on the other side in the longitudinal direction. The second material layer includes a third region including a third end located on one side in a longitudinal direction, and a fourth region including a fourth end located on the other side in the longitudinal direction and connected to the second region. The optical sensor further includes: a first electrode electrically connected to the first region; and a second electrode disposed apart from the first electrode and electrically connected to the third region. The first material layer has a width, perpendicular to the longitudinal direction, of 0.1 μm or more. The first material layer includes a thick portion located to include a center in a width direction of a cross section perpendicular to the longitudinal direction, and thin portions located on both sides of the thick portion and smaller in thickness than the thick portion. The thick portion has a thickness of 10 nm or more. The thin portions have widths together accounting for 15% or more.

DESCRIPTION OF EMBODIMENTS

Figure 1:
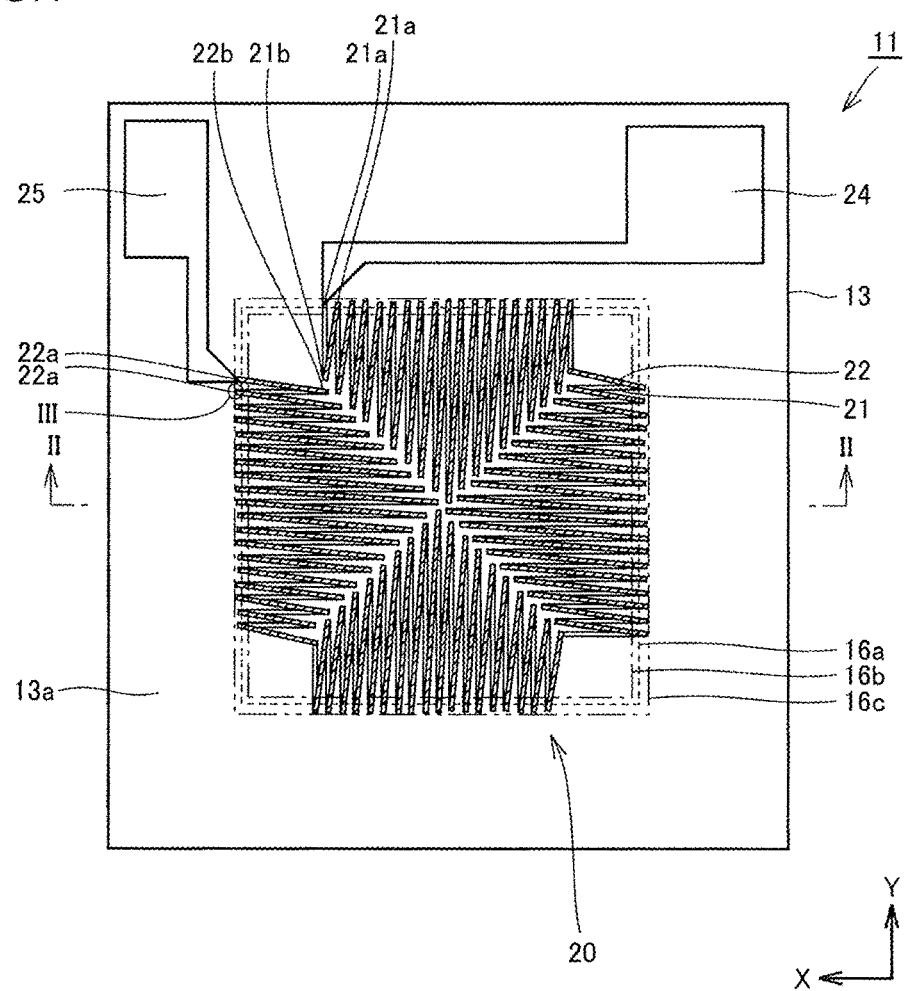
FIG. 1 is a schematic plan view showing an appearance of an optical sensor in Embodiment 1.

Problem to be Solved by the Present Disclosure

The infrared sensor disclosed in Patent Literature 1 has insufficient sensitivity and specific detectivity in some cases. Further improvement of sensitivity and specific detectivity is required.

Thus, one of the objects is to provide an optical sensor that can be improved in sensitivity and specific detectivity.

Effects of the Present Disclosure

According to the optical sensor described above, it is possible to achieve the improvements in sensitivity and specific detectivity.

DESCRIPTION OF EMBODIMENTS OF THE PRESENT DISCLOSURE

Firstly, embodiments of the present disclosure will be listed and described. The optical sensor according to the present disclosure includes: a support layer; a thermoelectric conversion material portion disposed on the support layer, the portion including a strip-shaped first material layer that converts thermal energy into electrical energy and a strip-shaped second material layer that is electrically conductive; and a light absorbing film disposed on the thermoelectric conversion material portion to form a temperature difference in a longitudinal direction of the first material layer, the film converting received light into thermal energy. The first material layer includes a first region including a first end located on one side in the longitudinal direction, and a second region including a second end located on the other side in the longitudinal direction. The second material layer includes a third region including a third end located on one side in a longitudinal direction, and a fourth region including a fourth end located on the other side in the longitudinal direction and connected to the second region. The optical sensor further includes: a first electrode electrically connected to the first region; and a second electrode disposed apart from the first electrode and electrically connected to the third region. The first material layer has a width, perpendicular to the longitudinal direction, of 0.1 μm or more. The first material layer includes a thick portion located to include a center in a width direction of a cross section perpendicular to the longitudinal direction, and thin portions located on both sides of the thick portion and smaller in thickness than the thick portion. The thick portion has a thickness of 10 nm or more. The thin portions have widths together accounting for 15% or more.

The optical sensor of the present disclosure includes the thermoelectric conversion material portion disposed on the support layer, the light absorbing film disposed on the thermoelectric conversion material portion, the first electrode, and the second electrode. The thermoelectric conversion material portion includes the strip-shaped first material layer that converts thermal energy into electrical energy, and the strip-shaped second material layer that is electrically conductive. The first material layer includes the first region including the first end located on one side in the longitudinal direction, and the second region including the second end located on the other side in the longitudinal direction. The second material layer includes the third region including the third end located on one side in the longitudinal direction, and the fourth region including the fourth end located on the other side in the longitudinal direction, the fourth region being connected to the second region. The light absorbing film is disposed on the thermoelectric conversion material portion so as to form a temperature difference in the longitudinal direction of the first material layer, and converts the received light into thermal energy. The first electrode is electrically connected to the first region. The second electrode is disposed apart from the first electrode and electrically connected to the second region. When a temperature difference is formed in the longitudinal direction of the first material layer by the light absorbing film, a potential difference occurs in the first material layer in the longitudinal direction. The potential difference between the first electrode and the second electrode is detected, to thereby detect light, for example infrared rays.

As for the first material layer included in the thermoelectric conversion material portion disposed on the support layer, it is necessary to avoid disconnection and also avoid peeling from the support layer when the first material layer is disposed directly on the support layer. Therefore, it is necessary to ensure the minimum width and thickness of the first material layer. According to the optical sensor of the present disclosure, the width of the first material layer perpendicular to the longitudinal direction is 0.1 μm or more, and the thickness of the thick portion is 10 nm or more. It is thus possible to reduce the risks of the disconnection and peeling by securing both the minimum width and minimum thickness of the first material layer.

According to the optical sensor of the present disclosure, the first material layer includes the thin portions disposed on both sides of the thick portion and having a smaller thickness than the thick portion. The thin portions have their widths together accounting for 15% or more. This reduces the cross-sectional area of the first material layer as compared to the case where the thickness is constant in the whole layer. It is therefore possible to reduce the thermal conductance of the first material layer, thereby improving the sensitivity and specific detectivity of the optical sensor.

As described above, according to the optical sensor of the present disclosure, it is possible to improve the sensitivity and specific detectivity of the optical sensor while suppressing the disconnection and peeling of the first material layer.

In the above optical sensor, the thin portions may each have the thickness decreasing with increasing distance from the thick portion. Such a configuration enables easy production of the thin portions.

In the above optical sensor, the cross section of the first material layer perpendicular to the longitudinal direction may include a first side facing the support layer, a second side located apart from the first side in a thickness direction of the thick portion, and a pair of third sides connecting the first side and the second side. The cross section may have a trapezoidal shape with the first side greater in length than the second side. The first material layer including the thick portion and thin portions having such a shape can be easily produced. The trapezoidal shape does not have to be geometrically exactly trapezoidal. For example, the second side may not be strictly parallel to the first side, or two sides may be connected by a curve.

The above optical sensor may have a relationship of $2 \leq \tan \theta \times (w/d) \leq 10.7$ in the cross section of the first material layer perpendicular to the longitudinal direction, where w represents the length of the first side, d represents the thickness of the thick portion, and $\theta$ represents an angle between the first side and the third side. With the relationship of $2 \leq \tan \theta \times (w/d) \leq 10.7$ being held for the angle $\theta$ between the first and third sides, the length of the first side, and the thickness of the thick portion, it is possible to reduce the cross-sectional area and reduce the thermal conductance $G_{th}$ while securing the minimum width and minimum thickness of the first material layer. Thus, the sensitivity and specific detectivity can be improved more efficiently. It should be noted that the relationship of $2 \leq \tan \theta \times (w/d) \leq 7.0$ is suitable for further improvement of the sensitivity Rv and the specific detectivity D*.

In the above optical sensor, the first material layer may have a surface roughness Ra (arithmetic mean roughness) of not less than 1 nm and not more than 200 nm. Setting the surface roughness Ra to be 1 nm or more can suppress heat conduction on the surface of the first material layer, and can reduce the thermal conductance $G_{th}$. When the surface roughness Ra becomes greater than 200 nm, phonon scattering due to the surface asperities of the first material layer is promoted, resulting in the thermal conductance $G_{th}$ starting to decrease. Therefore, setting the surface roughness Ra of the first material layer within the above-described range can further improve the sensitivity and specific detectivity of the optical sensor. With regard to the surface roughness Ra, making the surface roughness Ra equivalent to the length of phonon mean free path can further reduce the thermal conductance $G_{th}$. The surface roughness is suitably not less than 8 nm and not more than 100 nm from the standpoint of further improvement of the sensitivity Rv and the specific detectivity D*.

In the above optical sensor, the surface roughness Ra of the first material layer may be not less than 13 nm and not more than 50 nm. This can further improve the sensitivity Rv and the specific detectivity D*.

In the above optical sensor, the first material layer may be made of a semiconductor having a p- or n-type conductivity type. This can efficiently reduce the thermal conductance of the first material layer because semiconductors have relatively low thermal conductivity.

In the above optical sensor, the second material layer may be made of a metal or a semiconductor having a conductivity type different from that of the first material layer and converting thermal energy into electrical energy. When a semiconductor of the conductivity type different from that of the first material layer is adopted for the second material layer, the thermal conductance of the optical sensor can be reduced by using the material having relatively low thermal conductivity. This can increase the output based on the temperature difference and further improve the sensitivity and specific detectivity of the optical sensor. When a metal is adopted for the second material layer, the electrical conductance of the optical sensor can be increased with the increased electrical conductivity of the second material layer, leading to further improvement of the specific detectivity of the optical sensor.

In the above optical sensor, the first material layer may contain Si and Ge as base material elements and Au as an additive element. The support layer may include a buffer layer that is made of Si and disposed in contact with the first material layer. In the case where Si, Ge, and Au are selected as the elements constituting the first material layer, SiGe microcrystals with Au as the nucleus can be partially formed in the first material layer during the crystallization process, which increases the electrical conductivity of the first material layer. However, if the first material layer and the support layer come into contact with each other, Au may precipitate on the support layer side, and the effect of forming the microcrystals as described above may not be obtained sufficiently. The support layer that includes the buffer layer made of Si and disposed in contact with the first material layer can suppress the precipitation of Au on the support layer side. This can promote the formation of the microcrystals with Au as the nucleus in the first material layer, and suppress the decrease in electrical conductivity of the first material layer. It is therefore possible to further improve the sensitivity and specific detectivity of the optical sensor.

The above optical sensor may further include a plurality of first material layers and a plurality of second material layers. The plurality of first material layers and the plurality of second material layers may be arranged alternately in such a manner that the first region and the third region are electrically connected and the second region and the fourth region are electrically connected, except for the first region connected to the first electrode and the third region connected to the second electrode. With such a configuration, the potential difference output by the first and second electrodes can be made to be the sum of the potential differences occurring in the individual first material layers, resulting in an increased potential difference. It is therefore possible to improve the sensitivity and specific detectivity of the optical sensor.

DETAILS OF THE EMBODIMENTS OF THE PRESENT DISCLOSURE

Embodiments of the optical sensor of the present disclosure will be described below with reference to the drawings. In the following drawings, the same or corresponding parts are denoted by the same reference numerals and the description thereof will not be repeated.

Embodiment 1

Figure 2:
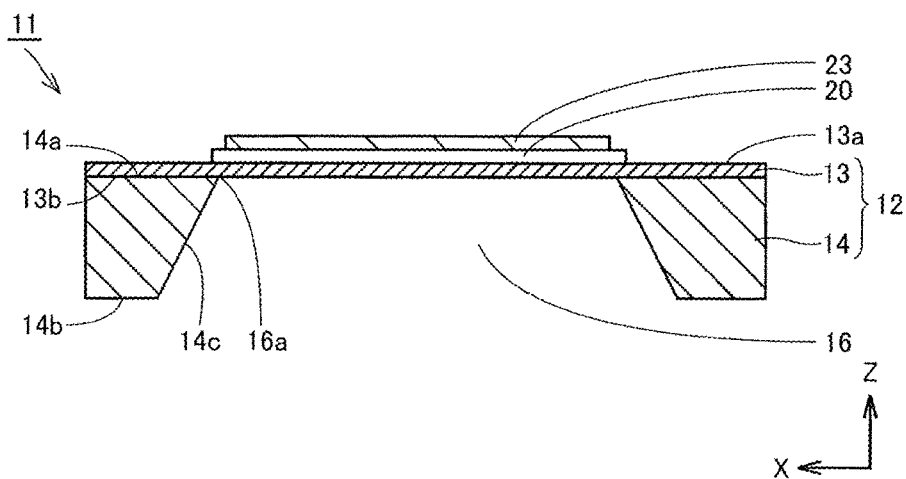
FIG. 2 is a schematic cross-sectional view showing part of a cross section along the line segment II-II in FIG. 1.
Figure 3:
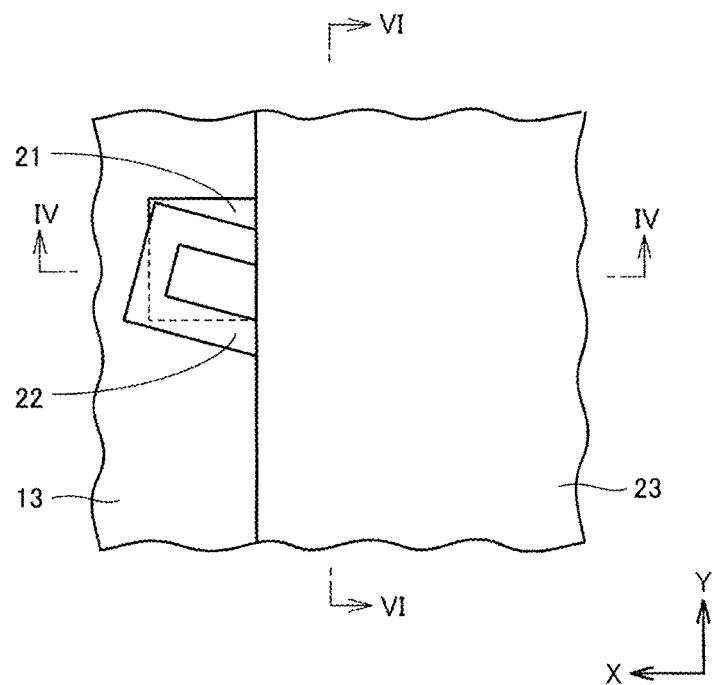
FIG. 3 is an enlarged view of a region indicated by III in FIG. 1.
Figure 4:
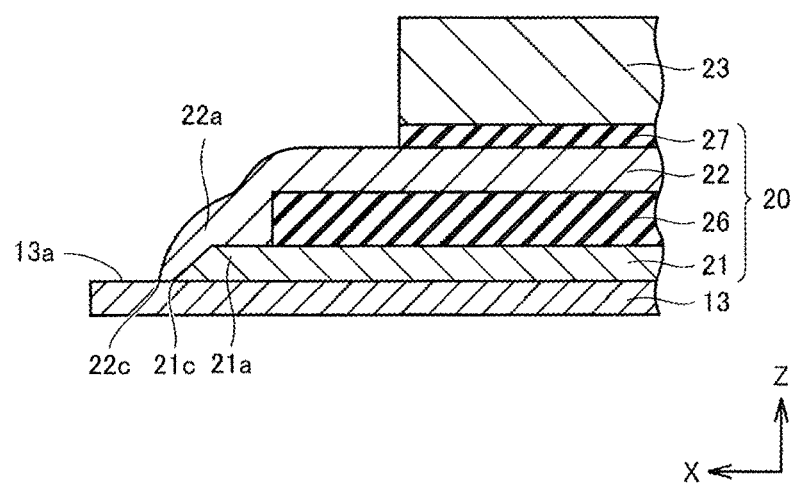
FIG. 4 is a schematic cross-sectional view showing a cross section along the line segment IV-IV in FIG. 3.
Figure 5:
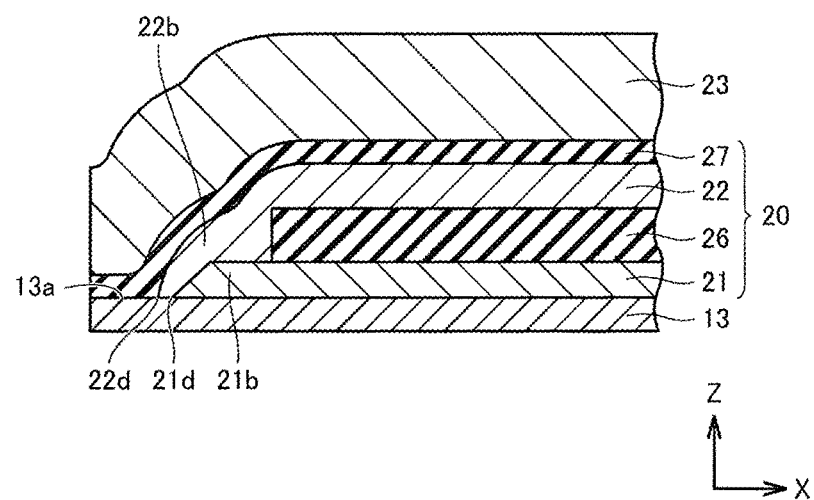
FIG. 5 is a schematic cross-sectional view showing a portion of the optical sensor in Embodiment 1.

A description will be made of an optical sensor according to Embodiment 1 of the present disclosure. FIG. 1 is a schematic plan view showing an appearance of the optical sensor in Embodiment 1. FIG. 2 is a schematic cross-sectional view showing a cross section along the line segment II-II in FIG. 1. The line segment II-II passes through the center of gravity as well as the midpoint of each of the sides facing each other in an X direction of a rectangular-shaped base portion 12, which will be described later. FIG. 3 is an enlarged view of a region indicated by III in FIG. 1. FIG. 4 is a schematic cross-sectional view showing a cross section along the line segment IV-IV in FIG. 3. FIG. 5 is a schematic cross-sectional view showing a portion of the optical sensor in Embodiment 1. FIG. 5 is a schematic cross-sectional view of the portion including second and fourth regions, which will be described later. In FIG. 1, an infrared absorbing film 23, which will be described later, is shown simply with the single-dotted chain line. In FIG. 2, a cross section of a thermoelectric conversion material portion 20 disposed on a base portion 12, which will be described later, is shown in simplified form.

Referring to FIGS. 1, 2, 3, 4, and 5, the optical sensor 11 is, for example, an infrared sensor. The optical sensor 11 includes a base portion 12, a thermoelectric conversion material portion 20 disposed on the base portion 12, and an infrared absorbing film 23 as a light absorbing film disposed on the thermoelectric conversion material portion 20. The infrared absorbing film 23 is arranged in a region 16b indicated by the single-dotted chain line in FIG. 1, and converts infrared rays into heat. The thermoelectric conversion material portion 20 converts a temperature difference (thermal energy) into electrical energy. The thermoelectric conversion material portion 20 includes a plurality of strip-shaped first material layers 21 composed of a semiconductor of a p type, which is a first conductivity type, and a plurality of strip-shaped second material layers 22 composed of a semiconductor of an n type, which is a second conductivity type different from the first conductivity type. In the present embodiment, the thermoelectric conversion material portion 20 is made up of the plurality of first material layers 21, the plurality of second material layers 22, an insulating film 26, and an insulating film 27. The optical sensor 11 includes a first electrode 24 and a second electrode 25. The insulating film 27 is disposed between the infrared absorbing film 23 and the second material layers 22 (see particularly FIG. 4). The optical sensor 11 detects a potential difference generated between the first electrode 24 and the second electrode 25 to thereby detect infrared rays irradiated onto the optical sensor 11.

When the entire optical sensor 11 is regarded as a plate, its thickness direction is represented by the direction indicated by the arrow Z in FIG. 2. The base portion 12 has a rectangular shape as observed in the thickness direction. The base portion 12 includes a support layer 13 and a body portion 14. The body portion 14 has two trapezoidal shapes in the cross section shown in FIG. 2. The support layer 13 is disposed on a surface 14a of the body portion 14. The surface 14a is a surface that corresponds to the longer side of a pair of parallel sides of each trapezoid in the cross section in FIG. 2. The support layer 13 supports the thermoelectric conversion material portion 20, made up of the first material layers 21, the second material layers 22, the insulating film 26, and the insulating film 27, the infrared absorbing film 23, the first electrode 24, and the second electrode 25. The support layer 13 is made, for example, of a $SiO_2/SiN/SiO_2$ film. That is, the support layer 13 is composed of lamination of $SiO_2$, SiN, and $SiO_2$. The body portion 14 is made of Si, for example. The body portion 14 is configured to be sufficiently thick compared to the support layer 13, for example at least ten times thicker than the support layer 13.

The optical sensor 11 has a recessed portion 16 formed to be concave in the thickness direction. The plate-shaped support layer 13 is formed on the surface 14a. As observed from an opposite surface 14b side, the support layer 13 is exposed in a region corresponding to the recessed portion 16. The body portion 14 has its inner peripheral surface 14c surrounding the recessed portion 16 that is of a so-called tapered shape with a wider opening side located on the surface 14b side. The recessed portion 16 is formed, for example, by anisotropic wet etching of the body portion 14. In FIG. 1, a boundary 16a between the body portion 14 and the support layer 13 is indicated by the broken line. The recessed portion 16 can suppress heat escape from the infrared absorbing film 23 to the body portion 14, leading to greater temperature differences in the longitudinal direction in the first material layers 21 and the second material layers 22.

The thermoelectric conversion material portion 20 including the first material layers 21, the second material layers 22, and the insulating films 26 and 27, the first electrode 24, and the second electrode 25 are disposed on the support layer 13, specifically on a surface 13a on one side of the support layer 13. A plurality of first material layers 21 and a plurality of second material layers 22 are provided. The first material layers 21 and the second material layers 22 each have a strip shape. The plurality of first material layers 21 and the plurality of second material layers 22 are arranged to fit within a rectangular region 16c that is indicated by the double-dotted chain line in FIG. 1 as observed in the thickness direction of the optical sensor 11. Each first material layer 21 includes a first region 21a including a first end 21c located on one side in a longitudinal direction, and a second region 21b including a second end 21d located on the other side in the longitudinal direction. The direction in which a line connecting the first region 21a and the second region 21b extends becomes the longitudinal direction of the first material layer 21 having the strip shape. In FIG. 3, the X direction corresponds to the longitudinal direction of the first material layer 21. Each second material layer 22 includes a third region 22a including a third end 22c located on one side in a longitudinal direction, and a fourth region 22b including a fourth end 22d located on the other side in the longitudinal direction and connected to the second region 21b. The direction in which a line connecting the third region 22a and the fourth region 22b extends becomes the longitudinal direction of the second material layer 22 having the strip shape. The first region 21a and the third region 22a are located on the side near the periphery of the region 16c, and the second region 21b and the fourth region 22b are located on the side near the center of the region 16c.

The plurality of first material layers 21 are arranged spaced apart from each other. The plurality of second material layers 22 are arranged spaced apart from each other. The first material layers 21 and the second material layers 22 are connected alternately, except for the first region 21a connected to the first electrode 24 and the third region 22a connected to the second electrode 25. Specifically, a first material layer 21 has its first region 21a electrically connected to the third region 22a of a second material layer 22 that is adjacent on one side of the first material layer 21. The first material layer 21 has its second region 21b electrically connected to the fourth region 22b of another second material layer 22 that is adjacent on the other side of the first material layer 21, i.e., on the opposite side from the second material layer 22 with its third region 22a connected. The plurality of first material layers 21 and the plurality of second material layers 22 have the second regions 21b and the fourth regions 22b including their ends near the center of the region 16c electrically connected to each other and the first regions 21a and the third regions 22a including their ends near the periphery of the region 16c electrically connected to each other, except for the first region 21a that is connected to the first electrode 24 and the third region 22a that is connected to the second electrode 25. In other words, with the first material layers 21 and the second material layers 22 being paired, the adjacent first material layer 21 and second material layer 22 are electrically connected alternately at their regions including their ends. As the material for the first material layers 21 to be composed of a p-type thermoelectric conversion material, a compound semiconductor having Si and Ge as base material elements and Au as an additive element, for example, is selected. As the material for the second material layers 22 to be composed of an n-type thermoelectric conversion material, Bi is selected, for example. Further, carbon (C), for example, is selected as the material for the infrared absorbing film 23. SiO$_2$, for example, is selected as the material for the insulating films 26 and 27.

The first material layers 21 and the second material layers 22 are configured such that their longitudinal lengths become shorter as they approach the four corners of the rectangular-shaped region 16c. Further, the first material layers 21 and the second material layers 22 are formed in the region 16c excluding the regions including the four corners thereof, for the following reasons. If the first material layers 21 and the second material layers 22 are arranged in the regions near the four corners, despite the increase in resistance, the longitudinal lengths of the first material layers 21 and the second material layers 22 will become short, making it unable to secure sufficient lengths to form temperature differences between their ends. In the present embodiment, the first and second material layers 21 and 22 that are shortest in the longitudinal direction have a length of about ⅔ of the length of the first and second material layers 21 and 22 that are longest in the longitudinal direction. The plurality of first material layers 21 and the plurality of second material layers 22 are arranged alternately so as to extend from one side toward the opposite side of the rectangular-shaped region 16c (such that their longitudinal directions correspond to their extending directions). In the present embodiment, the connection points between the plurality of first material layers 21 and the plurality of second material layers 22 are positioned on the sides of isosceles triangles that correspond to the sides and diagonal lines of the rectangle of the region 16c.

The first material layers 21 are disposed on the surface 13a of the support layer 13. That is, in the present embodiment, the first material layers 21 are disposed directly on the support layer 13. The insulating film 26 is disposed so as to cover the first material layers 21, except for the portions where the first regions 21a and the second regions 21b are located. As observed in the thickness direction of the optical sensor 11, the insulating film 26 is disposed on the first material layers 21 in the regions where the first material layers 21 are disposed, and on the surface 13a of the support layer 13 in the regions where the first material layers 21 are not disposed. The insulating film 26 is formed to expose the first regions 21a and the second regions 21b of the first material layers 21. The second material layers 22 are disposed on the insulating film 26, except for the portions where the third regions 22a and the fourth regions 22b are located. The third regions 22a of the second material layers 22 are disposed on the first regions 21a of the first material layers 21 and the surface 13a of the support layer 13. The fourth regions 22b of the second material layers 22 are disposed on the second regions 21b of the first material layers 21. The insulating film 27 is disposed on the second material layers 22, except for the portions where the third regions 22a are located. The infrared absorbing film 23 is disposed on the insulating film 27. The insulating film 27 and the infrared absorbing film 23 are formed so as to expose the first regions 21a of the first material layers 21 and the third regions 22a of the second material layers 22. That is, the infrared absorbing film 23 is disposed on portions of the first material layers 21 and portions of the second material layers 22. The first regions 21a including the first ends 21c of the first material layers 21 and the third regions 22a including the third ends 22c of the second material layers 22 are not covered by the infrared absorbing film 23. This results in temperature differences formed in the longitudinal directions of the first material layers 21 and the second material layers 22. The first material layers 21 and the second material layers 22 are thermally connected to the infrared absorbing film 23 so as to form a temperature difference in the longitudinal direction in each of the first material layers 21 and the second material layers 22. The layers are arranged such that the heat of the infrared absorbing film 23 is transferred to the second regions 21b of the first material layers 21 near the center of the region 16c and to the fourth regions 22b of the second material layers 22 near the center of the region 16c.

With respect to the direction of the temperature gradient that occurs when light strikes the optical sensor 11, the voltage generated at one end of a first material layer 21 has a polarity opposite to the polarity of the voltage generated at one end of a second material layer 22. In the present embodiment, when light strikes, the end of the first material layer 21 located on the outer peripheral side attains a positive voltage, and the end of the second material layer 22 located on the outer peripheral side attains a negative voltage. Here, the plurality of first material layers 21 and the plurality of second material layers 22 are electrically connected alternately throughout. Of the alternately connected first material layers 21 and second material layers 22, the first material layer 21 located at the most end has its first region 21a electrically connected to the first electrode 24. Of the first material layers 21 and second material layers 22 alternately connected in series, the second material layer 22 located at the most end has its third region 22a electrically connected to the second electrode 25. The first electrode 24 and the second electrode 25 are disposed on the surface 13a of the support layer 13, outside the region 16c. The first electrode 24 and the second electrode 25 are formed apart from each other. The first electrode 24 and the second electrode 25 are pad electrodes, for example. Examples of the materials adopted for the first and second electrodes 24 and 25 include gold (Au), titanium (Ti), and platinum (Pt).

The configuration of the first material layers 21 will now be described. The second material layers 22 are identical to the first material layers 21 in terms of external shape, although they are different in conductivity type, so the description thereof will not be repeated.

Figure 6:
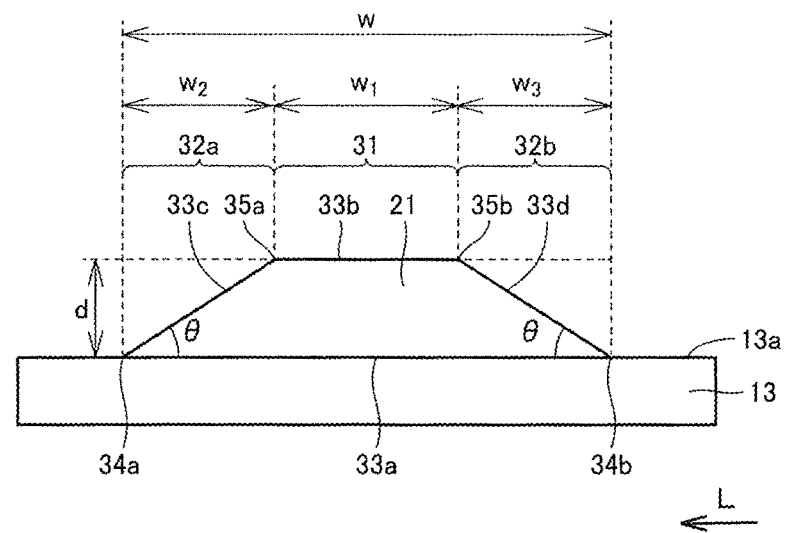
FIG. 6 is a schematic cross-sectional view showing a first material layer and a support layer in a cross section along the line segment VI-VI in FIG. 3.

The first material layers 21 have a strip shape, each with a different length, as described above. FIG. 6 is a schematic cross-sectional view showing a first material layer 21 and the support layer 13 in a cross section along the line segment VI-VI in FIG. 3. FIG. 6 corresponds to the cross section perpendicular to the longitudinal direction of the first material layer 21.

Referring to FIG. 6, the first material layer 21, in its cross section perpendicular to the longitudinal direction shown in FIG. 6, includes a thick portion 31 located to include the center in a width direction, indicated by L in FIG. 6, of the cross section perpendicular to the longitudinal direction, and thin portions 32a and 32b disposed on both sides of the thick portion 31 and having a smaller thickness than the thick portion 31. The pair of thin portions 32a and 32b is provided so as to sandwich the thick portion 31 in the width direction. The thick portion 31 has a thickness d. The first material layer 21 has a width perpendicular to the longitudinal direction of 0.1 μm or more. The width perpendicular to the longitudinal direction of the first material layer 21 is more preferably 1 μm or more. The width perpendicular to the longitudinal direction of the first material layer 21 is even more preferably 5 μm or more. In the present embodiment, the width of the first material layer 21 perpendicular to the longitudinal direction is 8 μm (8000 nm). The width perpendicular to the longitudinal direction of the first material layer 21 corresponds to the length w of a first side 33a, which will be described later. The first material layer 21 has a thickness, which is the thickness d of the thick portion 31, of 10 nm or more. The thickness d of the thick portion 31 is more preferably 50 nm or more. The thickness d of the thick portion 31 is even more preferably 100 nm or more. In the present embodiment, the thick portion 31 has the thickness d of 200 nm.

The cross section perpendicular to the longitudinal direction of the first material layer 21 includes a first side 33a facing the support layer 13, a second side 33b spaced apart from the first side 33a in the thickness direction of the thick portion 31, and third sides 33c and 33d each connecting the first side 33a and the second side 33b. The third side 33c connects an edge 34a in the width direction of the first side 33a and an edge 35a in the width direction of the second side 33b. The third side 33d connects an edge 34b in the width direction of the first side 33a and an edge 35b in the width direction of the second side 33b. The first material layer 21 is arranged in such a manner, in the cross section perpendicular to the longitudinal direction thereof, that the surface corresponding to the first side 33a comes into contact with one surface 13a of the support layer 13, that the surface corresponding to the second side 33b comes into contact with the insulating film 26 and part of the second material layer 22, and that the surface corresponding to the third side 33c and the surface corresponding to the third side 33d come into contact with the insulating film 26 and part of the second material layer 22. It should be noted that the thickness d corresponds to the length in the Z direction between the first side 33a and the second side 33b.

The width of the first material layer 21 corresponds to the length w of the first side 33a. The cross section perpendicular to the longitudinal direction of the first material layer 21 has a trapezoidal shape with the length w of the first side 33a being greater than the length $w_1$ of the second side 33b. The first side 33a and the second side 33b are parallel. The surfaces corresponding to the first side 33a, the second side 33b, and the third sides 33c and 33d are flat. The width $w_2$ of the thin portion 32a and the width $w_3$ of the thin portion 32b are equal. In the present embodiment, the first material layer 21 is symmetrical in the cross section shown in FIG. 6.

The thin portions 32a and 32b have their thicknesses decreasing with increasing distance from the thick portion 31. In the present embodiment, the thickness of the thin portion 32a decreases gradually from the edge 35a toward the edge 34a. Similarly, the thickness of the thin portion 32b decreases gradually from the edge 35b toward the edge 34b. In the present embodiment, for the angle θ between the first side 33a and the third side 33c, a relationship of 2≤tan θ×(w/d)≤10.7 holds. In this case, the angle θ is selected so that the angle θ becomes an acute angle. Specifically, for example, the length of the first side 33a (corresponding to the width) w=8000 nm, the thickness d=200 nm, and θ=4° are selected. Similarly, for the angle θ between the first side 33a and the third side 33d, the relationship of 2≤tan θ×(w/d)≤10.7 holds. In the present embodiment, the angle θ between the first side 33a and the third side 33c and the angle θ between the first side 33a and the third side 33d are the same.

The widths $w_2$ and $w_3$ of the pair of thin portions 32a and 32b together account for 15% or more of the entire width. In this case, the length $w_1$ of the second side 33b corresponding to the width of the thick portion 31 is less than 85%. The width $w_2+w_3$ is preferably 40% or more of the entire width.

In this case, the length $w_1$ of the second side 33b corresponding to the width of the thick portion 31 is less than 60%.

A method of producing the optical sensor 11 in Embodiment 1 will now be described in brief. Firstly, a flat plate-shaped body portion 14 is prepared, and a support layer 13 is formed on one surface 14a thereof in the thickness direction. Next, a recessed portion 16 is formed in the central region of the body portion 14, from the other surface 14b of the body portion 14 located on the side opposite to the support layer 13 in the thickness direction. In this case, the recessed portion 16 is formed to be concave from the other surface 14b to reach a surface 13b of the support layer 13. Thereafter, first material layers 21, an insulating film 26, second material layers 22, an insulating film 27, and an infrared absorbing film 23 are formed in a stacked manner on a surface 13a of the support layer 13.

Figure 7:
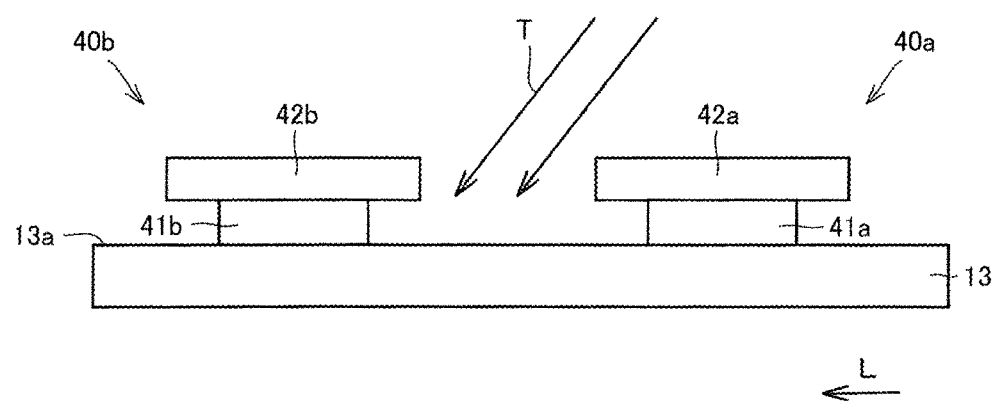
FIG. 7 is a schematic cross-sectional view showing the state where resist layers are formed on a base portion.

Here, the first material layers 21 are formed in the following manner. FIG. 7 is a schematic cross-sectional view showing the state where resist layers are formed on the support layer 13. Referring to FIG. 7, firstly, lift-off resist is applied in the form of layer on the surface 13a of the support layer 13. Next, positive resist is applied in the form of layer on top of the lift-off resist. The positive resist is then subjected to photolithography where it is exposed to light and dissolved by a developer. With this, the portion of the positive resist other than the masked area is removed. The lift-off resist is removed by side etching to a greater extent in the width direction than the positive resist. This results in resist layers 40a and 40b each having a T-shaped cross section, with the lift-off resist 41a, 41b being smaller in width than the positive resist 42a, 42b, in the width direction indicated by L in FIG. 7. That is, the resist layers 40a and 40b of the T shape in cross section, as shown in FIG. 7, are formed on the support layer 13. The resist layers 40a and 40b are each formed such that the portion that is connected to the support layer 13 of the body portion 14 (where the lift-off resist 41a, 41b is placed) is smaller in width, and the end portion that is not connected to the support layer 13 (where the positive resist 42a, 42b is placed) is greater in width.

The body portion 14 with the resist layers 40a and 40b formed is rotated in the plane including the support layer 13 to cause the semiconductor materials constituting the first material layers 21, specifically Si, Ge, and Au, to be deposited from an oblique direction indicated by the arrows T in FIG. 7. The arrows T indicate the flux of the deposition sources that is inclined with respect to the surface 13a in the cross section shown in FIG. 7. As a result, a first material layer 21 is formed on the surface 13a in a region between the resist layer 40a and the resist layer 40b. As the resist layers 40a and 40b each have the T-shaped cross section, the first material layer 21 is formed into a trapezoidal shape with its width greater in the region where the lift-off resists 41a and 41b are located and decreasing with increasing thickness of the first material layer 21. The resist layers 40a and 40b are then removed from the top of the support layer 13 (lift-off). In this manner, the first material layer 21 having the above-described cross-sectional shape shown in FIG. 6 is formed. The use of the resist layers 40a and 40b described above allows the first material layer 21 with a relatively small angle θ satisfying the relationship of 2≤tan θ×(w/d)≤10.7 to be produced more efficiently. Subsequently, activation treatment by heating at about 500° C. is conducted to partially crystallize Si, Ge, and so on in the amorphous state, to thereby obtain the first material layers 21. Thereafter, the insulating film 26 is formed on the surface 13a of the support layer 13 and the first material layers 21, with the first regions 21a and the second regions 21b left exposed. Then, the second material layers 22 are formed, making the first region 21a and the third region 22a contact each other and the second region 21b and the fourth region 22b contact each other. The second material layers 22 are formed in a similar manner as the first material layers 21. Thereafter, on the second material layers 22 and the insulating film 26, the insulating film 27 and further the infrared absorbing film 23 and so on are formed, whereby the optical sensor 11 is obtained.

An operation of the optical sensor 11 will now be described. When the optical sensor 11 is irradiated with light, for example infrared rays, the infrared absorbing film 23 converts the light energy into thermal energy. In this case, as the infrared absorbing film 23 is formed in the region 16b, the center side of the region 16b becomes particularly high in temperature. That is, the portion where the infrared absorbing film 23 is disposed becomes the high temperature side. On the other hand, outside the boundary 16a, the sufficiently thick body portion 14 functions as a heat sink and the temperature does not rise. That is, the portion outside the region where the infrared absorbing film 23 is formed becomes the low temperature side. Here, focusing on one first material layer 21, the second region 21b including the end of the strip-shaped first material layer 21 located at the center side of the region 16b becomes high in temperature, and the first region 21a including the end located outside the boundary 16a becomes low in temperature. That is, a temperature difference is formed between the regions including the ends in the longitudinal direction of a first material layer 21 and, hence, a potential difference is formed. For the second material layer 22 similarly having a strip shape in the longitudinal direction as well, a temperature difference is formed between the regions including the ends and, hence, a potential difference is formed. Since the plurality of first material layers 21 and the plurality of second material layers 22 are connected in series such that the polarity is reversed alternately, the potential difference output by the first and second electrodes 24 and 25 becomes the sum of the potential differences generated by the temperature differences in the plurality of first material layers 21 and the plurality of second material layers 22. The optical sensor 11 detects a current that flows due to this potential difference between the first and second electrodes 24 and 25, to thereby detect the light, in this case, infrared rays.

Here, according to the optical sensor 11 in the present embodiment, the first material layers 21 and the second material layers 22 each have a width perpendicular to the longitudinal direction of 0.1 μm or more. The thick portion 31 has the thickness of 10 nm or more. It is thus possible to reduce the risks of the disconnection and peeling of the first material layers and the second material layers 22 by securing the minimum width and thickness of the individual layers.

According to the optical sensor in the present embodiment, the first material layers 21 and the second material layers 22 each include a pair of thin portions 32a and 32b that are smaller in thickness than the thick portion 31. The combined width of the pair of thin portions 32a and 32b is 15% or more of the entire width. This reduces the cross-sectional area of each of the first material layers 21 and the second material layers 22 as compared to the case where the thickness is constant in the whole layer. It is therefore possible to reduce the thermal conductance Gil of the first material layers 21 and the second material layers 22, leading to improved sensitivity and specific detectivity of the optical sensor 11.

As described above, according to the optical sensor 11 of the present disclosure, it is possible to improve the sensitivity and specific detectivity of the optical sensor 11 while suppressing the disconnection and peeling of the first material layers 21 and the second material layers 22.

According to the present embodiment, the paired thin portions 32a and 32b each have the thickness d decreasing with increasing distance from the thick portion 31. The pair of thin portions 32a and 32b having such a configuration can be easily produced.

According to the present embodiment, the first material layers 21 and the second material layers 22 each have a cross section perpendicular to the longitudinal direction that includes the first side 33a facing the support layer 13, the second side 33b spaced apart from the first side 33a in the thickness direction of the thick portion 31, and a pair of third sides 33c and 33d each connecting the first side 33a and the second side 33b, and has a trapezoidal shape with the length w of the first side 33a being greater than the length $w_1$ of the second side 33b. The first material layers 21 and the second material layers 22 each having such a shape including the thick portion 31 and the pair of thin portions 32a and 32b can be easily produced by forming the resist layers 40a and 40b, having the T-shaped cross section as shown in FIG. 7, between first material layers 21 and between second material layers 22 and supplying the deposition sources from an oblique direction while rotating the body portion 14.

In the present embodiment, the first material layers 21 are composed of a semiconductor having the conductivity type of p type. This can efficiently reduce the thermal conductance of the first material layers 21 by virtue of relatively low thermal conductivity of semiconductors.

In the present embodiment, the thermoelectric conversion material portion 20 includes the second material layers 22 which are made of Bi of a second conductivity type, different from the conductivity type of the first material layers 21, and convert thermal energy into electrical energy. The use of the material having relatively low thermal conductivity reduces the thermal conductance of the optical sensor 11, thereby increasing the output based on the temperature difference. This can further improve the sensitivity and specific detectivity of the optical sensor 11.

According to the present embodiment, the optical sensor 11 includes a plurality of first material layers 21 and a plurality of second material layers 22. The plurality of first material layers 21 and the plurality of second material layers 22 are arranged alternately in such a manner that the first region 21a and the third region 22a are electrically connected and the second region 21b and the fourth region 22b are electrically connected, except for the region connected to the first electrode 24 and the region connected to the second electrode 25. Therefore, the potential difference output by the first and second electrodes 24 and 25 can be made to be the sum of the potential differences generated in the individual first material layers 21, resulting in a large potential difference. In this case, the potential differences generated in the individual second material layers 22 can be further added together, resulting in an even larger potential difference. It is therefore possible to improve the sensitivity and specific detectivity of the optical sensor 11.

Figure 8:
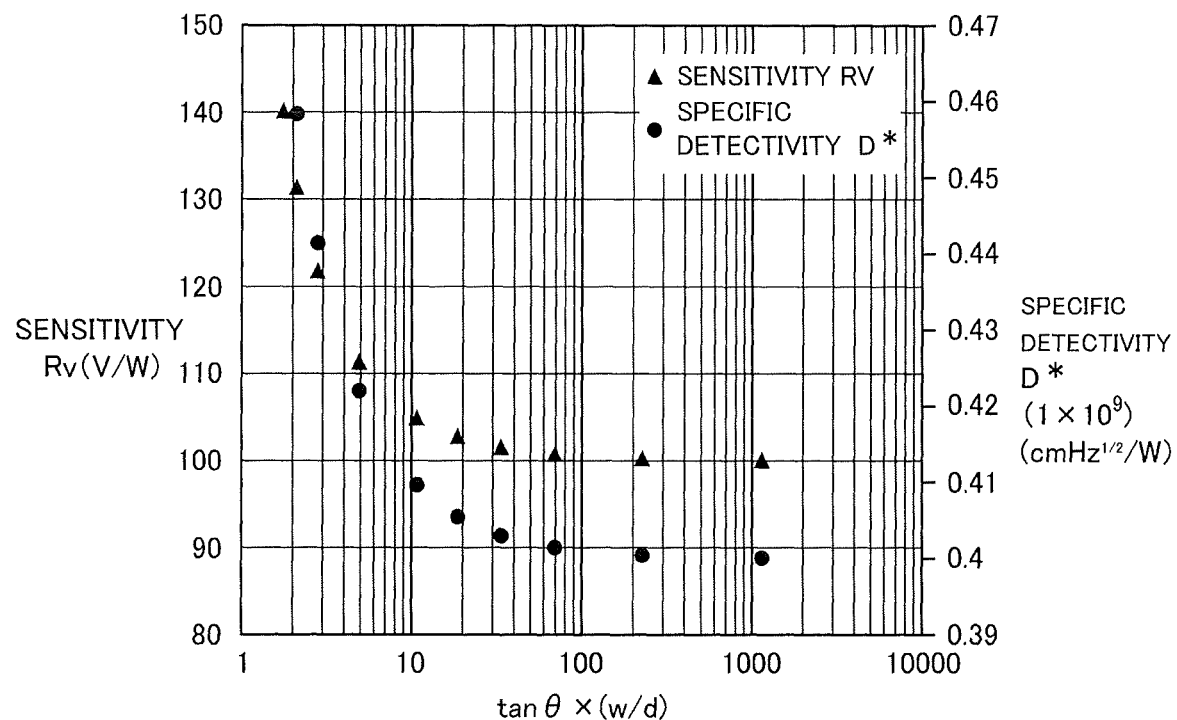
FIG. 8 is a graph showing a relationship between tan θ×(w/d) on one hand and sensitivity $Rv$ and specific detectivity $D^*$ on the other hand.

In the present embodiment, a relationship of $2 \leq \tan\theta \times (w/d) \leq 10.7$ holds for the angle θ between the first side 33a and the third side 33c, 33d. This can reliably improve the sensitivity and specific detectivity of the optical sensor 11. FIG. 8 is a graph showing the relationship of $\tan\theta \times (w/d)$ with sensitivity Rv and specific detectivity D*. In FIG. 8, the horizontal axis represents $\tan\theta \times (w/d)$, and the vertical axis represents sensitivity Rv and specific detectivity D* of the optical sensor 11. The horizontal axis uses a logarithmic scale. Each triangle indicates the value of sensitivity Rv, and each circle indicates the value of specific detectivity. For measurement of the sensitivity Rv, a 500 K blackbody furnace was used as a light source, the distance between the optical sensor 11 and the light source was set to be 30 cm, a mechanical chopper was used to chop the light source at a chopping frequency of 5 Hz, and a lock-in amplifier was used to synchronously detect the chopping frequency components of the device output. The sensitivity Rv was calculated from the output of the light source, the optical properties of the infrared absorbing film 23, and the output voltage of the optical sensor 11. The specific detectivity D* was calculated by observing the output of the optical sensor 11 with a spectrum analyzer and measuring the noise level. To calculate the angle θ, the cross section was observed using an electron microscope. It should be noted that the angle θ may be calculated by measuring, with an atomic force microscope (AFM), the top surface, i.e., the portion of the top surface of the first material layer 21 exposed from the surface where the infrared absorbing film 23 is disposed, or by measuring, with a stylus profilometer, the surface profile from the top surface in a direction perpendicular to the longitudinal direction of the first material layer 21.

Referring to FIG. 8, when tan θ×(w/d) takes a large value, the sensitivity Rv becomes small. The increase of the sensitivity Rv becomes more prominent as the value of tan θ×(w/d) approaches 1. The same trend applies to the specific detectivity D*. That is, when the value of tan θ×(w/d) is large, the specific detectivity D* is small, and as the value of tan θ×(w/d) approaches 1, the increase of the specific detectivity becomes more prominent. Thus, it is possible to more reliably increase the values of the sensitivity and specific detectivity by setting the value of tan θ×(w/d) to be not more than 10.7. It is preferable to set the value of tan θ×(w/d) to be not less than 2 from the standpoint of production. Therefore, setting tan θ×(w/d) to satisfy 2≤tan θ×(w/d)≤10.7 can improve the sensitivity and specific detectivity. It is more suitable to set tan θ×(w/d) to have the relationship of 2≤tan θ×(w/d)≤7.0.

Embodiment 2

Figure 9:
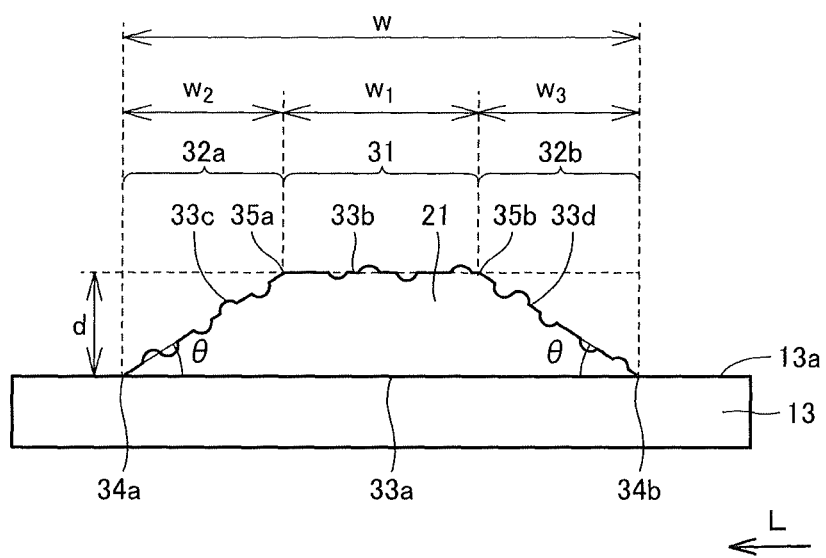
FIG. 9 is a schematic cross-sectional view showing a first material layer and a support layer of an optical sensor in Embodiment 2.

Another embodiment, Embodiment 2, will now be described. FIG. 9 is a schematic cross-sectional view showing a first material layer and a support layer included in an optical sensor in Embodiment 2. FIG. 9 corresponds to the cross section shown in FIG. 6 in Embodiment 1. Referring to FIG. 9, the optical sensor 11 in Embodiment 2 differs from that of Embodiment 1 in that the surfaces corresponding to the second side 33b and the third sides 33c and 33d have a surface roughness Ra within the range of not less than 1 nm and not more than 200 nm. In FIG. 9, the asperities formed on the surfaces corresponding to the second side 33b and the third sides 33c and 33d are exaggeratedly illustrated for ease of understanding.

Referring to FIG. 9, fine asperities are formed on the surfaces corresponding to the second side 33b and the third sides 33c. The surface roughness Ra (arithmetic mean roughness) of the surfaces corresponding to the second side 33b and the third sides 33c and 33d is not less than 1 nm and not more than 200 nm. The surface roughness Ra was measured in the following manner. A rectangular-shaped region including an exposed first material layer 21, having one side equal to or greater in length than the width of the thick portion, was measured with an AFM using a cantilever having a radius of curvature of 25 nm. Following the correction for the inclination of the region of the thick portion 31 of the first material layer 21, the surface roughness Ra was calculated from the linear surface profile for the length of half the width of the thick portion 31. It should be noted that the calculation of the surface roughness Ra from the linear surface profile may be performed on any straight line in the region of the thick portion 31 of the first material layer 21.

In order to make the surfaces corresponding to the second side 33b and the third sides 33c and 33d have the surface roughness Ra described above, the following producing method, for example, is selected. For the first material layer 21, Si, Ge, and Au are deposited on the surface 13a in an amorphous state, and crystallized by heat treatment. During this heat treatment, or, at the time of crystallization during the activation treatment, the heat treatment temperature is adjusted within the range of 300° C. to 1000° C. to control the degree of progress of crystallization, thereby achieving the surface roughness Ra within the above-described range.

Figure 10:
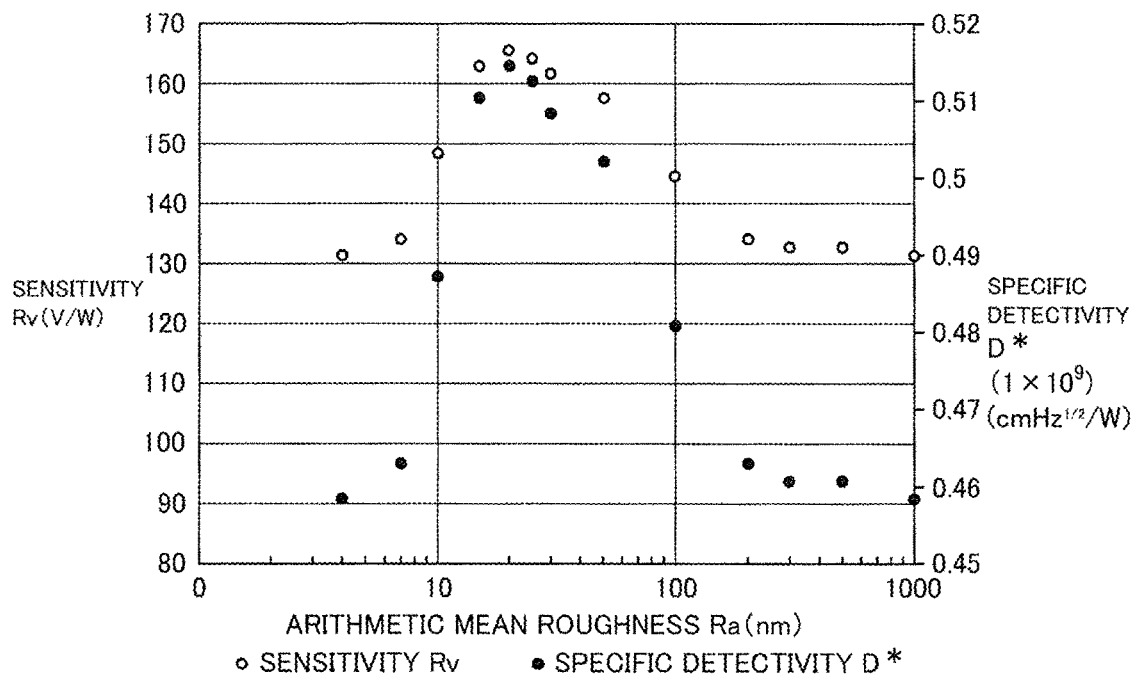
FIG. 10 is a graph showing a relationship between surface roughness Ra on one hand and sensitivity Rv and specific detectivity D* on the other hand.

FIG. 10 is a graph showing the relationship between surface roughness Ra on one hand and sensitivity Rv and specific detectivity D* on the other hand. In FIG. 10, the horizontal axis represents surface roughness Ra (nm), and the vertical axis represents sensitivity Rv and specific detectivity D* of the optical sensor 11. The horizontal axis is expressed in logarithm. In FIG. 10, each hollow circle indicates the value of the sensitivity Rv, and each solid circle indicates the value of the specific detectivity. The measurement results shown in FIG. 10 are those obtained from a similar measurement as the case shown in FIG. 8. That is, for measurement of the sensitivity Rv, a 500 K blackbody furnace was used as a light source, the distance between the optical sensor 11 and the light source was set to be 30 cm, a mechanical chopper was used to chop the light source at a chopping frequency of 5 Hz, and a lock-in amplifier was used to synchronously detect the chopping frequency components of the device output. The sensitivity Rv was calculated from the output of the light source, the optical properties of the infrared absorbing film 23, and the output voltage of the optical sensor 11. The specific detectivity D* was calculated by observing the output of the optical sensor 11 with a spectrum analyzer and measuring the noise level.

Referring to FIG. 10, when the surface roughness Ra is not less than 1 nm and not more than 200 nm, the sensitivity Rv and the specific detectivity D* exhibit relatively high values. As the surface becomes smoother, heat conduction is suppressed and the thermal conductance $G_{th}$ decreases. As the degree of surface asperities increases, phonon scattering is promoted and the thermal conductance $G_{th}$ decreases. Therefore, setting the surface roughness Ra to be not less than 1 nm and not more than 200 nm can improve the sensitivity Rv and the specific detectivity D*. More preferably, it is suitable to set the surface roughness Ra to be not less than 8 nm and not more than 100 nm. Furthermore, the surface roughness Ra of the first material layer 21 may be not less than 13 nm and not more than 50 nm. This leads to further improvement of the sensitivity Rv and the specific detectivity D*.

Regarding the surface roughness Ra, when the surfaces corresponding to the third sides 33c and 33d defining the thin portions 32a and 32b are made to have the surface roughness Ra within the above-described range, the effect of reducing the heat conduction at the surfaces corresponding to the third sides 33c and 33d among the surfaces can be made more prominent. This can further improve the sensitivity and specific detectivity.

Embodiment 3

Figure 11:
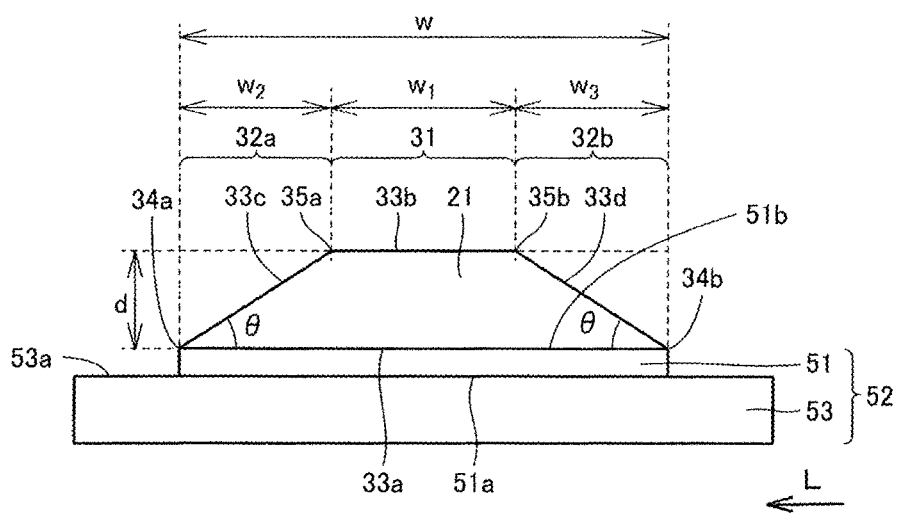
FIG. 11 is a schematic cross-sectional view showing a first material layer and a support layer of an optical sensor in Embodiment 3.

Yet another embodiment, Embodiment 3, will now be described. FIG. 11 is a schematic cross-sectional view showing a first material layer and a support layer included in an optical sensor in Embodiment 3. FIG. 11 corresponds to the cross section shown in FIG. 6 in Embodiment 1. Referring to FIG. 11, the support layer 52 included in the optical sensor in Embodiment 3 differs from that of Embodiment 1 in that it further includes a buffer layer 51.

In the case where Si, Ge, and Au are selected as the elements constituting the first material layer 21, SiGe microcrystals with Au as the nucleus can be partially formed in the first material layer 21 during the activation process of the first material layer 21, thereby increasing the electrical conductivity of the first material layer 21. However, if the first material layer 21 come into contact with a layer 53, Au may precipitate on the layer 53 side, in which case the effect of forming the microcrystals as described above may not be sufficiently obtained. Thus, the support layer 52 is made to include a buffer layer 51 made of Si and disposed in contact with the first material layer 21. This suppresses the precipitation of Au to the layer 53 side shown in FIG. 2, and promotes the formation of the microcrystals with Au as the nucleus in the first material layer 21, thereby suppressing the decrease in electrical conductivity of the first material layer 21. It is therefore possible to further improve the sensitivity and specific detectivity of the optical sensor 11. In the present embodiment, the buffer layer 51 has one surface 51a that is in contact with a surface 53a of the layer 53 and another surface 51b that is in contact with the surface corresponding to the first side 33a.

Figure 12:
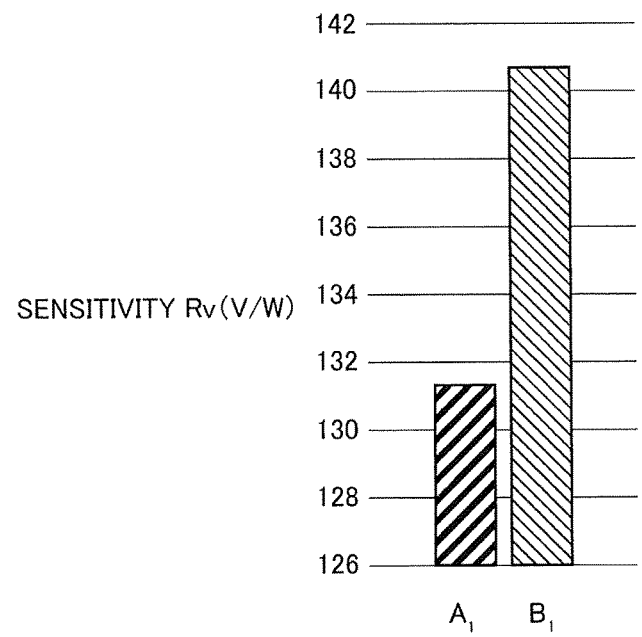
FIG. 12 is a graph showing a relationship between presence/absence of buffer layer and sensitivity Rv.
Figure 13:
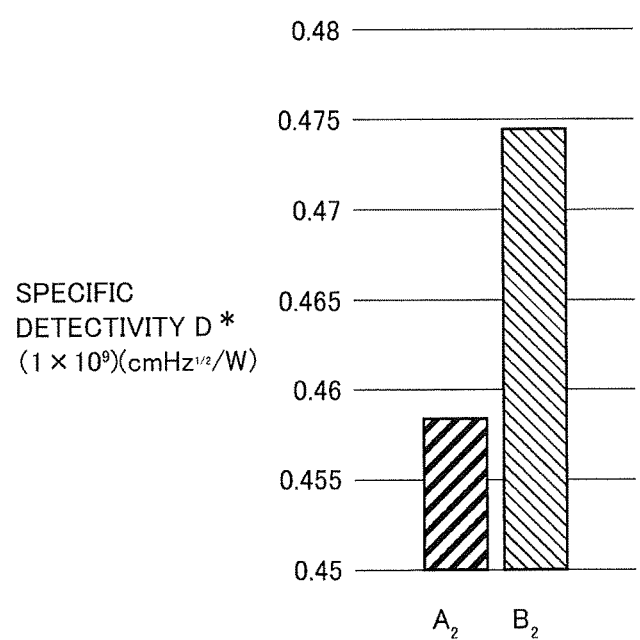
FIG. 13 is a graph showing a relationship between presence/absence of buffer layer and specific detectivity D*.

FIG. 12 is a graph showing a relationship between presence or absence of buffer layer and sensitivity Rv. FIG. 13 is a graph showing a relationship between presence or absence of buffer layer and specific detectivity D*. In FIGS. 12 and 13, the bar graphs $A_1$ and $A_2$ on the left side show the case where there is no buffer layer, and the bar graphs $B_1$ and $B_2$ on the right side show the case where there is a buffer layer. In FIG. 12, the vertical axis represents sensitivity Rv (V/W). In FIG. 13, the vertical axis represents specific detectivity $(1 \times 10^9)$ $(cmHz^{1/2}/W)$.

Referring first to FIG. 12, it can be understood that the sensitivity Rv with the presence of a buffer layer is greatly improved compared to the sensitivity Rv in the absence of a buffer layer.

Referring next to FIG. 13, it can be understood that the specific detectivity D* with the presence of a buffer layer is greatly improved compared to the specific detectivity D* in the absence of a buffer layer

OTHER EMBODIMENTS

In the above embodiments, the surfaces corresponding to the third sides 33c and 33d are assumed to be flat, but not limited to this, the surfaces corresponding to the third sides 33c and 33d may be curved. In this case, for example, in the thickness direction, they may be arc surfaces that protrude toward the surface corresponding to the second side 33b, or they may be arc surfaces that are concave toward the surface corresponding to the first side 33a. Furthermore, the surfaces corresponding to the third sides 33c and 33d may each include a plurality of curved and flat surfaces.

In the above embodiments, the first material layer 21 has a trapezoidal shape that is symmetrical in the width direction, but not limited to this, the width $w_2$ and the width $w_3$ may have different lengths. In the case where the angle θ between the first side 33a and the third side 33c and the angle θ between the first side 33a and the third side 33d differ in the first material layer 21, the above-described relational expression may hold for the smaller angle, or it may hold for both angles θ. Further, the first material layer 21 is not limited to a trapezoidal shape; it may have a shape in which there is a step between the thin portion 32a, 32b and the thick portion 31. That is, the surface corresponding to the third side 33c constituting the thin portion 32a may have a first vertical surface that extends from the edge 34a perpendicularly relative to the surface corresponding to the first side 33a, a parallel surface that is connected to the first vertical surface and extends parallel to the surface corresponding to the first side 33a, and a second vertical surface that is connected to the parallel surface and extends perpendicularly relative to the surface corresponding to the first side 33a to the edge 35a. The left and right angles θ may be different from each other. That is, the angle between the first side 33a and the third side 33c may be different from the angle between the first side 33a and the third side 33d. Furthermore, the first material layer 21 may have a triangular shape instead of a trapezoidal shape. That is, it may be configured without the second side 33b. While it has been configured such that the first material layers 21 included in the thermoelectric conversion material portion 20 are disposed directly on the support layer 13, not limited to this, it may be configured such that the first material layers 21 are not directly disposed on the support layer 13, and another member, such as an insulating film included in the thermoelectric conversion material portion 20, is interposed between the first material layers 21 and the support layer 13. Furthermore, the first material layers 21 and the second material layers 22 may be repositioned from each other. In this case, the producing method may be, for example, to form the second material layers 22 on the support layer 13, then form the insulating film 26, and then form the first material layers 21.

In the above embodiments, carbon may be used for the infrared absorbing film 23, or an infrared absorbing film made of resin may be formed. In the case of forming an infrared absorbing film made of resin having insulating properties, the insulating film 27 described above becomes unnecessary. Further, the conductivity type of the first material layers 21 and that of the second material layers 22 may be reversed. That is, the first material layers 21 may have the conductivity type of n type and the second material layers 22 may have the conductivity type of p type.

In the above embodiments, the first material layers 21 are made of a compound semiconductor containing Si, Ge, and Au as elements, but not limited to this, they may be made of a compound semiconductor without Au, a compound semiconductor containing Mn and Si as elements, a compound semiconductor containing Sn and Se as elements, or a compound semiconductor containing Cu and Se as elements. Further, for example, Si alone as a semiconductor may be used for the first material layers 21.

In the above embodiments, the second material layers 22 are made of Bi, but not limited to this, the second material layers 22 may be made of a metal or a semiconductor that converts thermal energy into electrical energy and has a different conductivity type from the first material layers 21. Specifically, for example, a compound semiconductor having the conductivity type of n type, other than Bi, may be used for the second material layers 22. When a semiconductor having the conductivity type of n type, which is the conductivity type different from that of the first material layers 21, is adopted for the second material layers 22, the thermal conductance of the optical sensor 11 can be reduced by using the material having relatively low thermal conductivity. This can increase the output based on the temperature difference and further improve the sensitivity and specific detectivity of the optical sensor 11. Further, a metal may be adopted for the second material layers 22. That is, the thermoelectric conversion material portion 20 may be configured to include the first material layers 21 described above and strip-shaped metal layers arranged in a similar manner as the second material layers 22 described above. Specifically, for example, Si may be used as the material that constitutes the first material layers 21, and Al may be used for the metal layers. Such a configuration may be adopted particularly in the case where the properties of the optical sensor 11 are mainly attributable to the properties of the material of the first material layers 21. With this configuration, the electrical conductivity of the second material layers 22 can be improved to increase the electrical conductance of the optical sensor 11, thereby further improving the specific detectivity of the optical sensor 11. For the second material layers 22, other materials, for example Sb (antimony), may be adopted. An alloy of Bi and Te (tellurium) or an alloy of Bi, Te, and Sb may also be adopted for the second material layers 22. In addition, while the optical sensor 11 is configured to include a plurality of first material layers 21 and a plurality of second material layers 22 in the above embodiments, the optical sensor 11 only needs to have a configuration that includes at least a pair of first material layer 21 and second material layer 22.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

DESCRIPTION OF REFERENCE NUMERALS

11: optical sensor; 12: base portion; 13, 52: support layer; 13a, 13b, 14a, 14b, 51a, 51b, 53a: surface; 14: body portion; 14c: inner peripheral surface; 16: recessed portion; 16a: boundary; 16b, 16c, 21a, 21b, 22a, 22b: region; 20: thermoelectric conversion material portion; 21: first material layer; 21c, 21d, 22c, 22d: end; 22: second material layer; 23: infrared absorbing film; 24: first electrode; 25: second electrode; 26, 27: insulating film; 31: thick portion; 32a, 32b: thin portion; 33a, 33b, 33c, 33d: side; 34a, 34b, 35a, 35b: edge; 40a, 40b: resist layer; 41a, 41b, 42a, 42b: resist; 51: buffer layer: 53: layer; $A_1$, $A_2$, $B_1$, $B_2$: graph; d: thickness; L: direction; T: arrow; w, $w_1$: length; $w_2$, $w_3$: width; and θ: angle.

The invention claimed is:

1. An optical sensor comprising:
a support layer;
a thermoelectric conversion material portion disposed on the support layer, the portion including a strip-shaped first material layer that converts thermal energy into electrical energy, and a strip-shaped second material layer that is electrically conductive; and
a light absorbing film disposed on the thermoelectric conversion material portion to form a temperature difference in a longitudinal direction of the first material layer, the film converting received light into thermal energy;
the first material layer including
a first region including a first end located on one side in the longitudinal direction and
a second region including a second end located on the other side in the longitudinal direction,
the second material layer including
a third region including a third end located on one side in a longitudinal direction and
a fourth region including a fourth end located on the other side in the longitudinal direction, the fourth region being connected to the second region,
the optical sensor further comprising:
a first electrode electrically connected to the first region; and
a second electrode disposed apart from the first electrode and electrically connected to the third region;
the first material layer having a width, perpendicular to the longitudinal direction, of 0.1 μm or more,
the first material layer including
a thick portion located to include a center in a width direction of a cross section perpendicular to the longitudinal direction and
thin portions located on both sides of the thick portion and smaller in thickness than the thick portion,
the thick portion having a thickness of 10 nm or more,
the thin portions having widths together accounting for 15% or more of the width of the first material layer,
wherein the cross section of the first material layer perpendicular to the longitudinal direction includes
a first side facing the support layer,
a second side located apart from the first side in a thickness direction of the thick portion, and
a pair of third sides connecting the first side and the second side,
the cross section having a trapezoidal shape with the first side being greater in length than the second side, and
wherein a relationship of $2 \leq \tan\theta \times (w/d) \leq 10.7$ exists in the cross section of the first material layer perpendicular to the longitudinal direction, where w represents the length of the first side, d represents the thickness of the thick portion, and θ represents an angle between the first side and each of the third sides.

2. The optical sensor according to claim 1, wherein the thin portions each have a thickness decreasing with increasing distance from the thick portion.

3. The optical sensor according to claim 1, wherein the first material layer is made of a semiconductor having a conductivity type of p or n type.

4. The optical sensor according to claim 3, wherein the second material layer is made of a metal or a semiconductor having a conductivity type different from that of the first material layer and converting thermal energy into electrical energy.

5. The optical sensor according to claim 4, wherein
the first material layer contains Si and Ge as base material elements and Au as an additive element, and
the support layer includes a buffer layer made of Si and disposed in contact with the first material layer.

6. The optical sensor according to claim 1, further comprising a plurality of said first material layers and a plurality of said second material layers, wherein
the plurality of first material layers and the plurality of second material layers are arranged alternately in such a manner that the first region and the third region are electrically connected and the second region and the fourth region are electrically connected, except for the first region connected to the first electrode and the third region connected to the second electrode.

7. The optical sensor according to claim 1, wherein the first material layer is made of a semiconductor having a conductivity type of n type.

8. The optical sensor according to claim 1, wherein the first material layer is disposed directly on the support layer.

9. The optical sensor according to claim 1, wherein the thin portions have a same width.

* * * * *